United States Patent [19]
Mogami

[11] Patent Number: 5,656,519
[45] Date of Patent: Aug. 12, 1997

[54] METHOD FOR MANUFACTURING SALICIDE SEMICONDUCTOR DEVICE

[75] Inventor: Tohru Mogami, Tokyo, Japan

[73] Assignee: NEC Corporation, Tokyo, Japan

[21] Appl. No.: 600,532

[22] Filed: Feb. 13, 1996

[30] Foreign Application Priority Data

Feb. 14, 1995 [JP] Japan ................................ 7-049037
Apr. 28, 1995 [JP] Japan ................................ 7-129771

[51] Int. Cl.$^6$ ................................................ H01L 21/336
[52] U.S. Cl. .................... 438/303; 438/305; 438/592;
438/230; 438/233; 438/970
[58] Field of Search .................... 437/41 SM, 41 GS,
437/190, 192, 193, 200, 228; 257/384,
413; 156/653.1

[56] References Cited

U.S. PATENT DOCUMENTS

| | | | |
|---|---|---|---|
| 4,784,971 | 11/1988 | Chiu et al. ................................ | 437/57 |
| 4,948,745 | 8/1990 | Pfiester et al. ............................ | 437/41 |
| 4,998,150 | 3/1991 | Rodder et al. . | |
| 5,164,333 | 11/1992 | Schwalke et al. ....................... | 437/200 |
| 5,168,072 | 12/1992 | Moslehi ..................................... | 437/41 |
| 5,322,809 | 6/1994 | Moslehi ..................................... | 437/41 |

FOREIGN PATENT DOCUMENTS

| | | | |
|---|---|---|---|
| 2-27737 | 1/1990 | Japan ................. | 437/41 SM |
| 2-288236 | 11/1990 | Japan . | |
| 3-288443 | 12/1991 | Japan ..................... | 437/192 |

OTHER PUBLICATIONS

"A Self–Aligned Elevated Source/Drain MOSFET," James R. Pfiester et al., IEEE Electron Device Letters, vol. 11, No. 9, Sep. 1990, pp. 365–367.

"Self–Aligned Tungsten Strapped Source/Drain and Gate Technology Realizing the Lowest Sheet Resistance for Sub–Quarter Micron CMOS," M. Sekine et al., IEEE IEDM, Dec./1994, pp. 493–496.

"W/WNx/Poly–Si Gate Technology for Future High Speed Deep Submicron CMOS LSIs," K. Kasai et al., IEEE IEDM, Dec./1994, pp. 497–500.

*Primary Examiner*—T. N. Quach
*Attorney, Agent, or Firm*—Foley & Lardner

[57] ABSTRACT

In a method for manufacturing a salicide MOS device, a gate insulating layer and a polycrystalline silicon gate electrode layer are formed on a monocrystalline silicon substrate. A sidewall insulating layer is formed on a sidewall of the gate electrode layer, and impurities are introduced into the substrate with a mask of the sidewall insulating layer and the gate electrode layer, thus forming impurity diffusion regions in the substrate. Then, an upper portion of the gate electrode layer is etched out. Finally, a metal layer is formed on the entire surface, and a heating operation is carried out, so that metal silicide layers are formed on upper portions of the gate electrodes and the impurity diffusion regions. In an alternative embodiment, the gate further comprises an intervening metal nitride layer.

21 Claims, 19 Drawing Sheets

METHOD FOR MANUFACTURING SALICIDE SEMICONDUCTOR DEVICE

BACKGROUND OF THE INVENTION

1. Field of the Invention

The present invention relates to a method for manufacturing a semiconductor device, and more particularly, to a method for manufacturing a MOS device having a salicide gate electrode and source/drain regions.

2. Description of the Related Art

As MOS devices have been scaled down to improve performance, the gate length of a gate electrode, i.e., the channel width has been shortened, and the junction depth of source/drain impurity diffusion regions has been shallowed. Therefore, the sheet resistances of the gate electrode and the source/drain impurity diffusion regions have been increased. As a result, the parasitic resistances of the gate electrode and the source/drain impurity diffusion regions have been increased in proportion to the channel resistance, thus decreasing drain current.

In order to suppress the decrease of the drain current, a first prior art method for manufacturing a salicide MOS device has been suggested (see: JP-A-2-288236). That is, a metal silicide layer is formed on the gate electrode and the source/drain impurity diffusion regions, thus reducing the parasitic resistances of the gate electrode and the source/drain impurity regions. This will be explained later in detail.

In the first prior art manufacturing method, however, since the metal silicide layer on the gate electrode is as high as a sidewall insulating layer formed on a sidewall of the gate electrode, if the metal silicide layer is extremely grown, a short circuit may occur between the gate electrode and the source/drain regions.

In a second prior art method for manufacturing a salicide MOS device (see: J. R. Pfiester et al., "A Self-Aligned Elevated Source/Drain MOSFET", IEEE Electron Device Letters, Vol. 11, No. 1, pp. 365–367, September 1990, and M. Sekine et al, "Self-Aligned Tungsten Strapped Source/Drain and Gate Technology Realizing the Lowest Sheet Resistance for Sub-quarter Micron CMOS", IEEE IEDM digest. abs. 19.3.1, pp. 493–496, 1994), a gate insulating layer, a polycrystalline silicon gate electrode layer and a silicon nitride layer (or a phosphosilicated glass (PSG) layer) are formed on a monocrystalline silicon substrate. A sidewall insulating layer is formed on a sidewall of the silicon nitride layer (or the PSG layer) and gate electrode layer. Then, impurties are introduced into the substrate with a mask of the sidewall insulating layer and the silicon nitride layer (or the PSG layer), thus forming source/drain impurity diffusion regions in the substrate. Then, the silicon nitride layer (or the PSG layer) is etched out by hot phosphoric acid (or diluted HF solution). Finally, a metal layer is formed on the entire surface, and a heating operation is carried out, so that metal silicide layers are formed on the gate electrodes and the impurity diffusion regions. Thus, the height of the metal silicide layer on the gate electrode layer is smaller than that of the sidewall insulating layer, so that the gate electrode layer is electrically isolated from the source/drain regions. Thus, no short circuit may be generated between the gate electrode layer and the source/drain regions. This will be explained later in detail.

In the second prior art manufacturing method, however, since the selectivity of etching for the silicon nitride layer (or the PSG layer) against the other silicon oxide layers is inferior, a short circuit may be generated between the gate electrode layer and the source/drain regions. On the contrary, if the etching of the silicon nitride layer (or the PSG layer) is insufficient, the growth of metal silicide is impeded.

SUMMARY OF THE INVENTION

It is an object of the present invention to provide a method for manufacturing a salicide MOS device in which gate electrodes are completely-electrically isolated from source/drain regions.

According to the present invention, in a method for manufacturing a salicide MOS device, a gate insulating layer and a polycrystalline silicon gate electrode layer are formed on a monocrystalline silicon substrate. A sidewall insulating layer is formed on a sidewall of the gate electrode layer, and impurties are introduced into the substrate with am ask of the sidewall insulating layer and the gate electrode layer, thus forming impurity diffusion regions in the substrate. Then, an upper portion of the gate electrode layer is etched out. Finally, a metal layer is formed on the entire surface, and a heating operation is carried out, so that metal silicide layers are formed on upper portions of the gate electrodes and the impurity diffusion regions. Thus, the metal silicide layers can be formed without using silicon nitride or PSG.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments prior art methods for manufacturing a salicide lightly-doped drain (LDD)-type CMOS device will be explained with reference to FIGS. 1A through 1D, and 2A through 2F.

FIGS. 1A through 1D illustrate a first prior art manufacturing method (see: JP-A-2-288236).

Figure 1A:
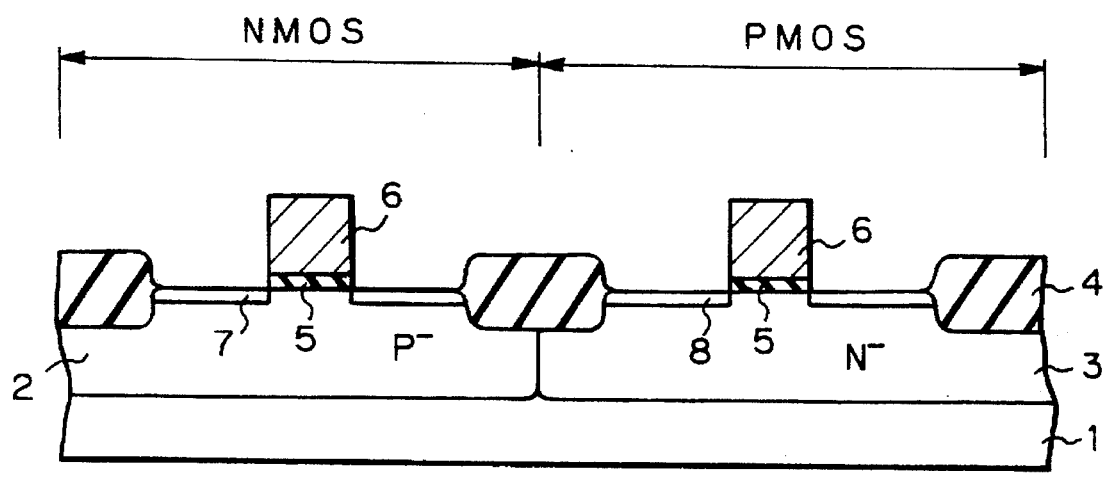
FIGS. 1A through 1D are cross-sectional views illustrating a first prior art method for manufacturing a salicide CMOS device.

First, referring to FIG. 1A, a P$^-$-type well 2 and an N$^-$-type well 3 are formed on a P$^-$-type (or N$^-$-type) monocrystalline silicon substrate 1. Then, a thick field silicon oxide layer 4 is grown by using a local oxidation of silicon (LOCOS) process, to partition an NMOS forming area and a PMOS forming area. Then, the P$^-$-type well 2 and the N$^-$-type well 3 are thermally oxidized to form a gate silicon oxide layer 5. Then, a non-doped polycrystalline silicon layer is deposited by a chemical vapor deposition (CVD) process. Then, the non-doped polycrystalline silicon layer with the gate silicon layer 5 is patterned by a photolithography process to form gate electrodes 6 on the gate silicon oxide layer 5. Then, phosphorous ions are implanted into the source/drain regions of the NMOS forming area with a mask of the gate electrode 6, to form N$^-$-type impurity regions 7. Also, boron ions are implanted into the source/drain regions of the PMOS forming area with a mask of the gate electrode 6, to form P$^-$-type impurity regions 8.

Figure 1B:
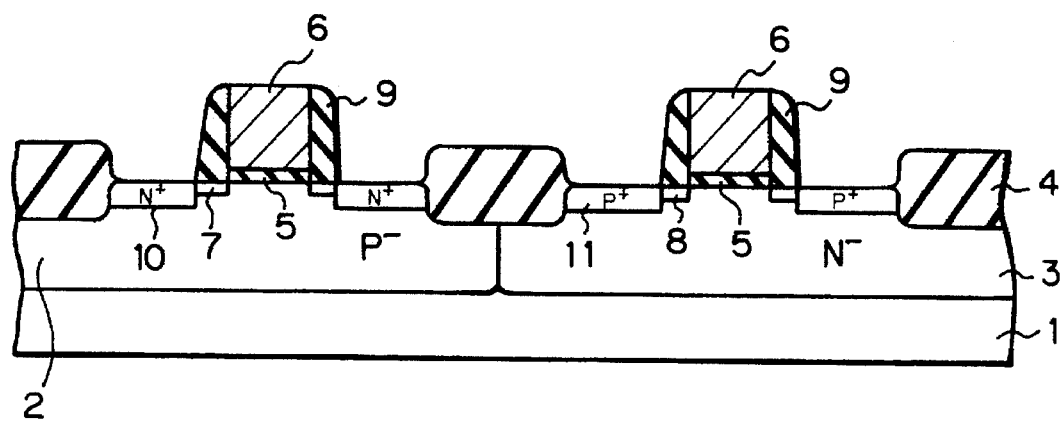

Next, referring to FIG. 1B, a silicon oxide layer is formed on the entire surface by a CVD process, and the silicon oxide layer is etched back by an anisotropic etching process. Thus, sidewall silicon oxide layers 9 are formed on sidewalls of the gate electrodes 6. Then, arsenic ions are implanted into the source/drain regions of the NMOS forming area with a mask of the gate electrode 6 and the sidewall silicon oxide layer 9, to form N$^+$-type impurity regions 10. Also, boron ions are implanted into the source/drain regions of the PMOS forming area with a mask of the gate electrode 6 and the sidewall silicon oxide layer 9, to form P$^+$-type impurity regions 11.

Figure 1C:
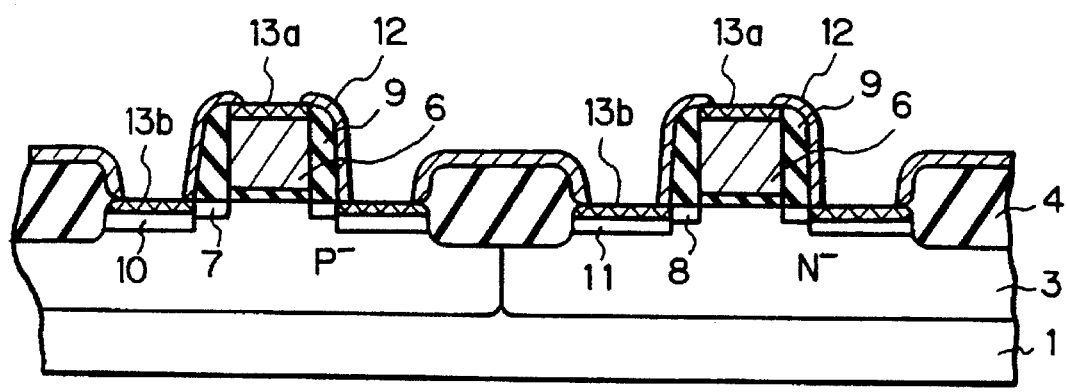

Next, referring to FIG. 1C, a titanium layer 12 is formed on the entire surface by a sputtering process. Then, the titanium layer 12 is reacted with the gate electrodes 6 and the source/drain regions 10 and 11 by a lamp annealing process, so that titanium silicide layers 13a and 13b are formed in self-alignment with the gate electrodes 6 and the source/drain regions 10 and 11.

Figure 1D:
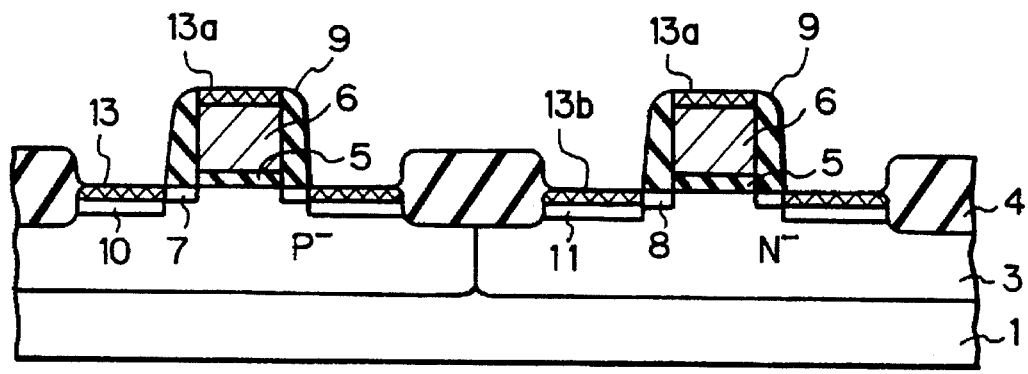

Finally, referring to FIG. 1D, unreacted portions of the titanium layer 12 are removed by a wet etching process using hydrogen peroxide water.

In the manufacturing method as illustrated in FIGS. 1A through 1D, if the titanium silicide layers 6a, 10a and 11a are extremely grown, a short circuit may occur between the gate electrodes 6 and the source/drain regions 10 and 11.

FIGS. 2A through 2F illustrate a second prior art manufacturing method (see: J. R. Pfiester et al., "A Self-Aligned Elevated Source/Drain MOSFET", IEEE Electron Device Letters, Vol. 11, No. 1, pp. 365–367, September 1990).

Figure 2A:
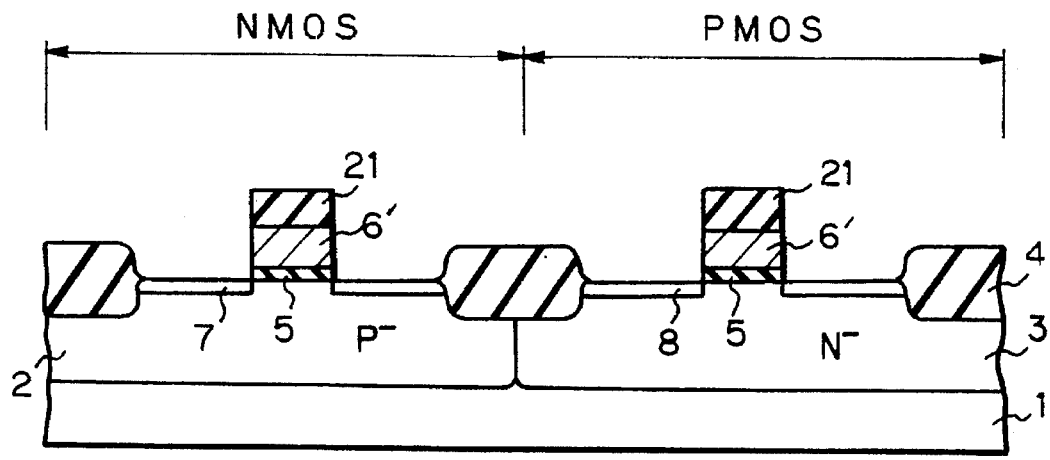
FIGS. 2A through 2F are cross-sectional views illustrating a second prior art method for manufacturing a salicide CMOS device.

First, referring to FIG. 2A, in a similar way to that in FIG. 1A, a P$^-$-type well 2 and an N$^-$-type well 3 are formed on a P$^-$-type (or N$^-$-type) monocrystalline silicon substrate 1. Then, a thick field silicon oxide layer 4 is grown by using a LOCOS process, to partition an NMOS forming area and a PMOS forming area. Then, the P$^-$-type well 2 and the N$^-$-type well 3 are thermally oxidized to form a gate silicon oxide layer 5. Then, an about 50 nm thick non-doped polycrystalline silicon layer and an about 300 nm thick silicon nitride layer are deposited by a CVD process thereon. Then, the silicon nitride layer and the non-doped polycrystalline silicon layer with the gate silicon layer 5 are patterned by an anistropic etching process to form silicon nitride layers 21 and gate electrodes 6' on the gate silicon oxide layer 5. Then, phosphorous ions are implanted into the source/drain regions of the NMOS forming area with a mask of the silicon nitride layer 21 and the gate electrode 6', to form N$^-$-type impurity regions 7. Also, boron ions are implanted into the source/drain regions of the PMOS forming area with a mask of the the silicon nitride layer 21 and gate electrode 6', to form P$^-$-type impurity regions 8.

Figure 2B:
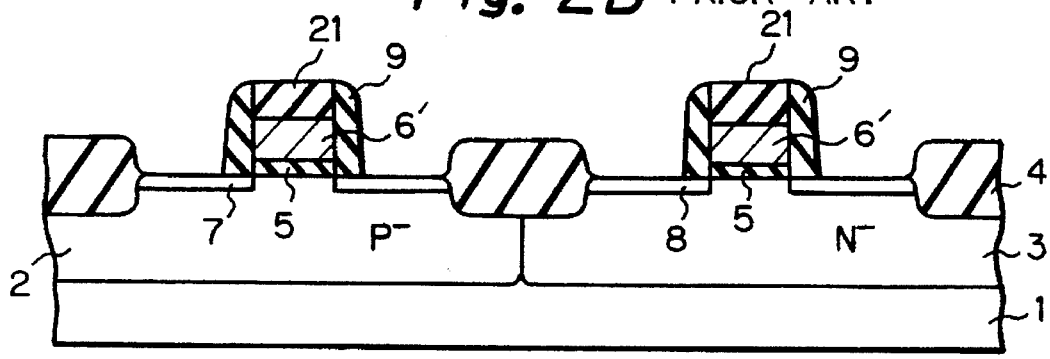

Next, referring to FIG. 2B, in the same way as in FIG. 1B, an about 250 nm thick silicon oxide layer is formed on the entire surface by a CVD process, and the silicon oxide layer is etched back by an anisotropic etching process. Thus, sidewall silicon oxide layers 9 are formed on sidewalls of the silicon nitride layers 21 and the gate electrodes 6'.

Figure 2C:
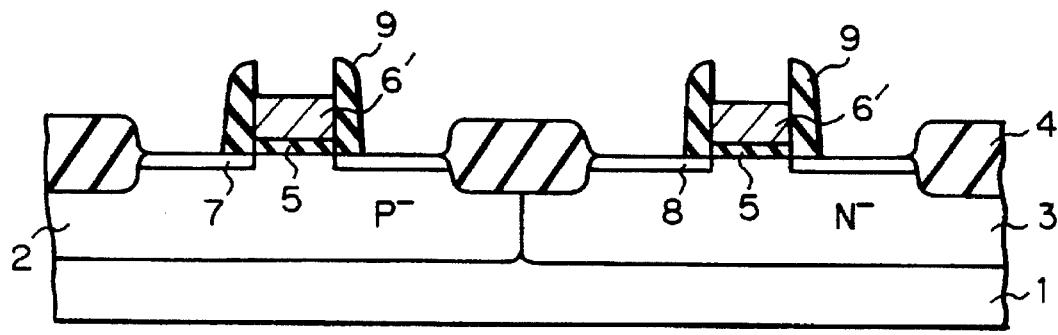

Next, referring to FIG. 2C, the silicon nitride layers 21 is removed by a wet etching process using hot phosphoric acid.

Figure 2D:
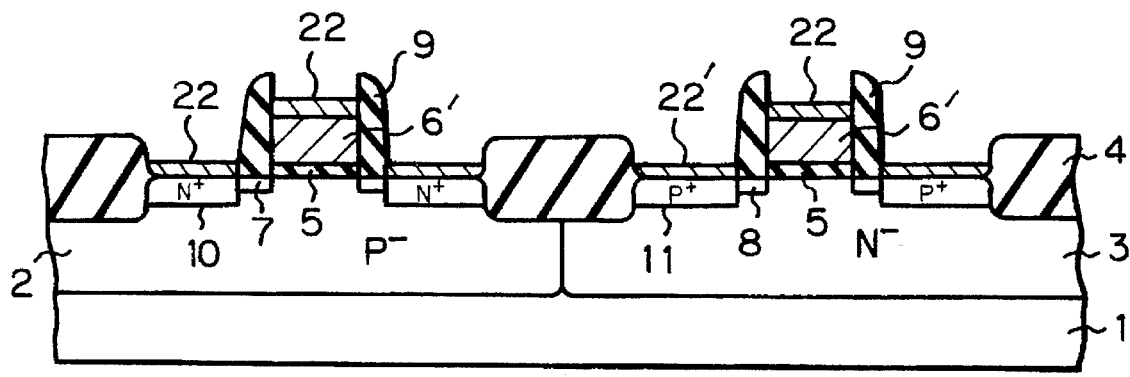

Next, referring to FIG. 2D, N-type polycrystalline silicon layers 22 are formed on the gate electrodes 6', and N-type eputaxial silicon layers 22' are formed on the source/drain regions. Then, arsenic ions are implanted into the source/drain regions of the NMOS forming area with a mask of the gate electrode 6 and the sidewall silicon oxide layer 9, to form N$^+$-type impurity regions 10. Also, boron ions are implanted into the source/drain regions of the PMOS forming area with a mask of the gate electrode 6 and the sidewall silicon oxide layer 9, to form P$^+$-type impurity regions 11.

Figure 2E:
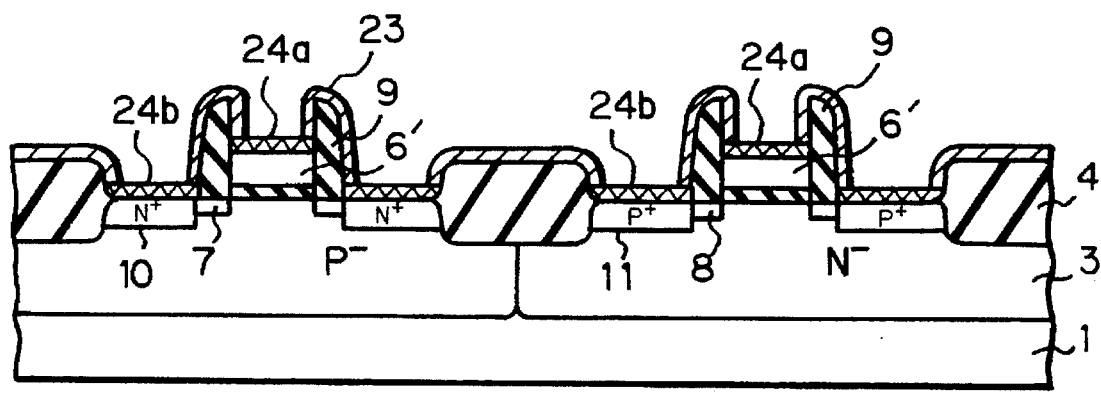

Next, referring to FIG. 2E, a titanium layer 23 is formed on the entire surface by a sputtering process. Then, the titanium layer 23 is reacted with the silicon layers 22 and 22' by a lamp annealing process, so that titanium silicide layers 24a and 24b are formed in self-alignment with the gate electrodes 6 and the source/drain regions 10 and 11.

Figure 2F:
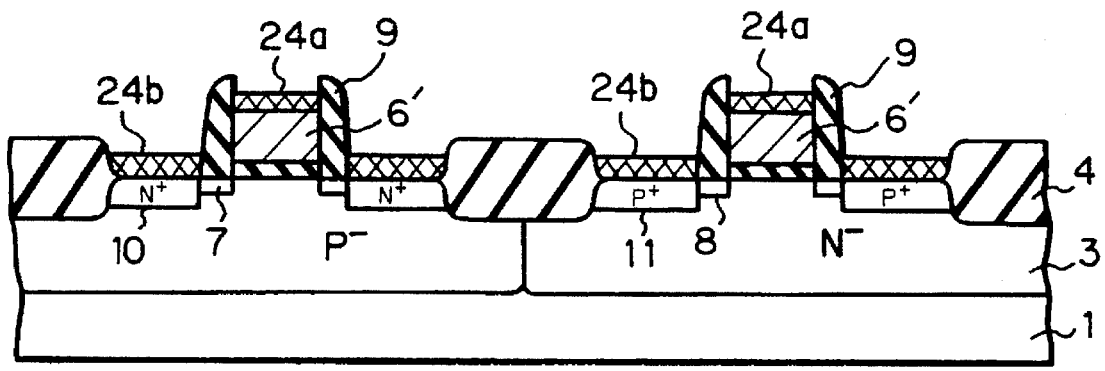

Finally, referring to FIG. 2F, unreacted portions of the titanium layer 23 are removed by a wet etching process using hydrogen peroxide water.

In the manufacturing method as illustrated in FIGS. 2A through 2F, since the height of the titanium silicide layers 24a on the gate electrodes 6' is smaller than that of the sidewall silicon oxide layers 9, the gate electrodes 6' may be electrically-isolated from the source/drain regions so that no short circuit may be Generated between the gate electrodes 6' and the source/drain regions 10 and 11.

In the manufacturing method as illustrated in FIGS. 2A through 2F, however, since the selectivity of etching for the silicon nitride layer 21 by using hot phosphoric acid against silicon oxide is inferior, the sidewall silicon oxide layer 9, the field silicon oxide layer 4 and the gate silicon oxide layer 5 are also etched. As a result, a short circuit also may occur between the gate electrodes 6' and the source/drain regions 10 and 11. On the contrary, if the etching of the silicon nitride layer 21 is insufficient, the growth of the titanium silicide layers 24a and 24b is impeded.

Also, in the method as illustrated in FIGS. 2A through 2F, a PSG layer can be used instead of the silicon nitride layer 21 (see: M. Sekine et al., "Self-Aligned Tungsten Strapped Source/Drain and Gate Technology Realizing the Lowest Sheet Resistance for Subquarter Micron CMOS", IEEE IDEM digest. abs. 19.3.1, pp. 493–496, 1994). Also, in this case, since the selectivity of etching for the PSG layer by using diluted HF solution against silicon oxide is inferior, the sidewall silicon oxide layer 9, the field silicon oxide layer 4 and the gate silicon oxide layer 5 are also etched. As a result, a short circuit also may occur between the gate electrodes 6' and the source/drain regions 10 and 11. On the contrary, if the etching of the PSG layer is insufficient, the growth of the titanium silicide layers 24a and 24b is impeded.

FIGS. 3A through 3E illustrate a first embodiment of the method for manufacturing a salicide LDD-type CMOS device according to the present invention.

Figure 3A:
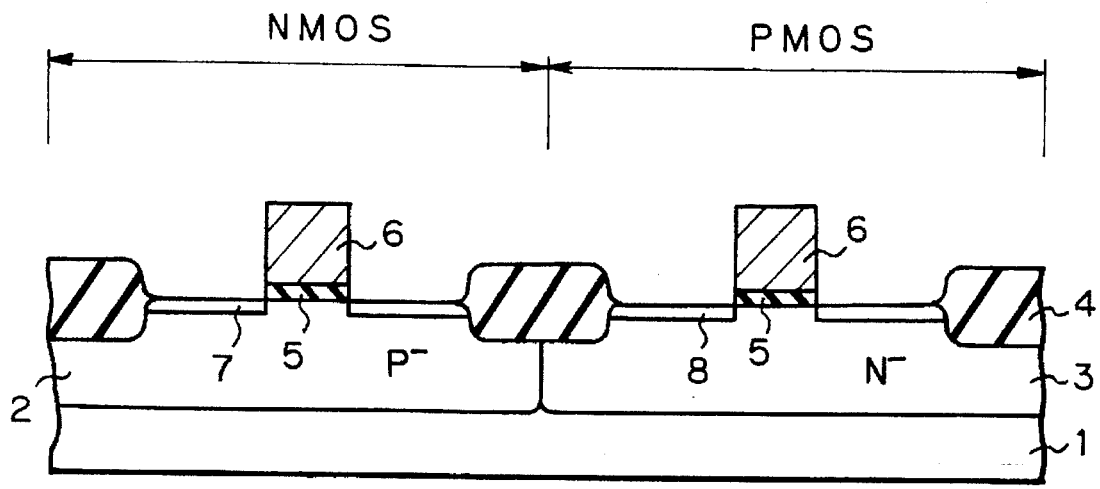
FIGS. 3A through 3E are cross-sectional views illustrating a first embodiment of the method for manufacturing a salicide CMOS device according to the present invention.

First, referring to FIG. 3A, in the same way as in FIG. 1A, a P⁻-type well 2 and an N⁻-type well 3 are formed on a P⁻-type (or N⁻-type) monocrystalline silicon substrate 1. Then, a thick field silicon oxide layer 4 is grown by using a LOCOS process, to partition an NMOS forming area and a PMOS forming area. Then, the P⁻-type well 2 and the N⁻-type well 3 are thermally oxidized to form a gate silicon oxide layer 5. Then, an about 300 nm thick non-doped polycrystalline silicon layer is deposited by a CVD process thereon. Then, the non-doped polycrystalline silicon layer with the gate silicon layer 5 is patterned by a photolithography process to form gate electrodes 6 on the gate silicon oxide layer 5. Then, phosphorous ions are implanted into the source/drain regions of the NMOS forming area with a mask of the gate electrode 6, to form N⁻-type impurity regions 7. Also, boron ions are implanted into the source/drain regions of the PMOS forming area with a mask of the gate electrode 6, to form P⁻-type impurity regions 8.

Figure 3B:
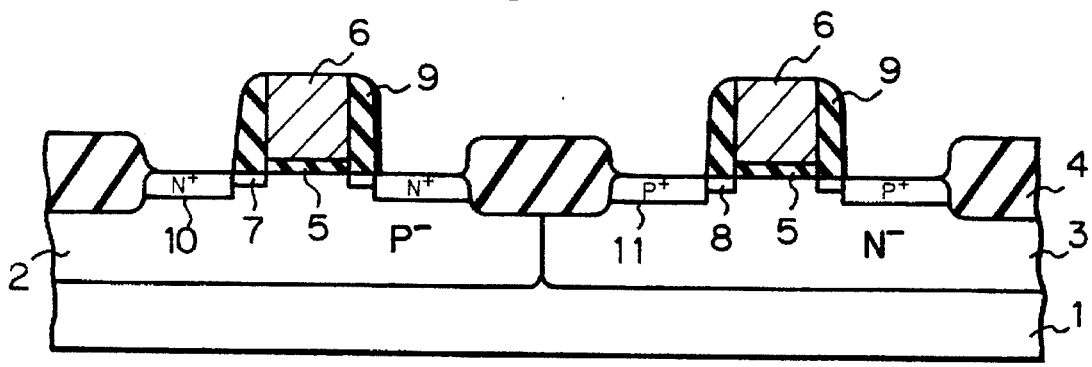

Next, referring to FIG. 3B, in the same way as in FIG. 1B, a silicon oxide layer is formed on the entire surface by a CVD process, and the silicon oxide layer is etched back by an anisotropic etching process. Thus, sidewall silicon oxide layers 9 are formed on sidewalls of the gate electrodes 6. Then, arsenic ions are implanted into the source/drain regions of the NMOS forming area with a mask of the gate electrode 6 and the sidewall silicon oxide layer 9, to form N⁺-type impurity regions 10. Also, boron ions are implanted into the source/drain regions of the PMOS forming area with a mask of the gate electrode 6 and the sidewall silicon oxide layer 9, to form P⁺-type impurity regions 11.

Figure 3C:
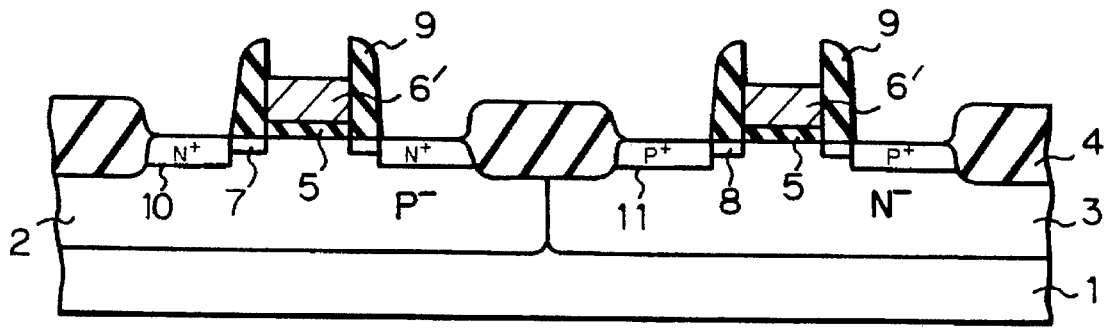
Figure 4:
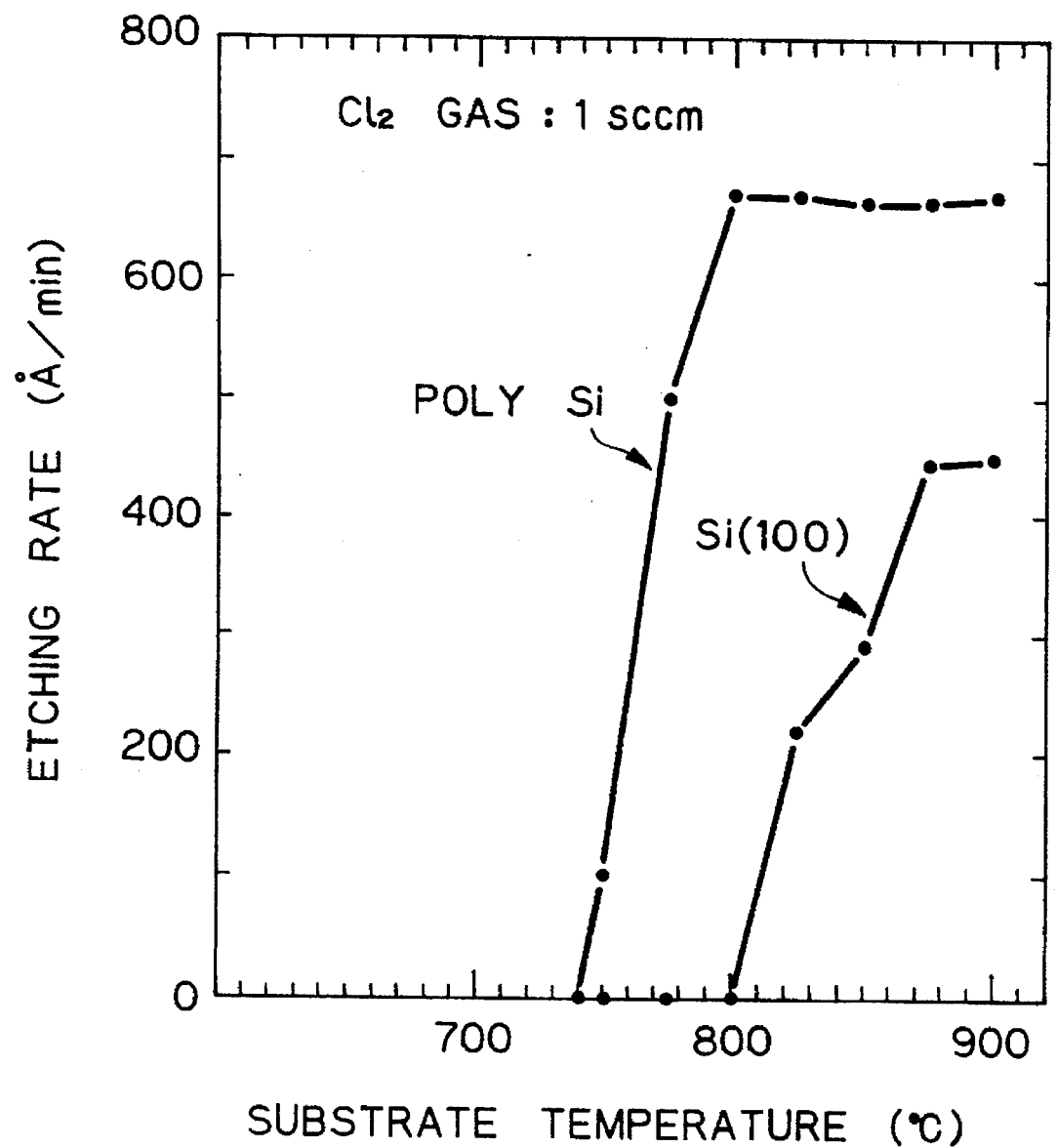
FIG. 4 is a graph for showing the selectivity of etching by chlorine gas.

Next, referring to FIG. 3C, only upper portions of the gate electrodes 6 are selectively removed by a vapor phase etching process using chlorine gas. That is, the device is put into a vacuum chamber whose pressure is about $1\times10^{-9}$ Torr. In addition, chlorine gas is introduced thereinto at a stream rate of about 1 sccm corresponding to a partial pressure of about $1\times10^{-4}$ Torr, and the substrate temperature of the device is caused to be about 740° C. to 880° C. As shown in FIG. 4, there is a large difference in etching rate by chlorine gas between polycrystalline silicon and monocrystalline silicon such as (100) crystal. Particularly, when the substrate temperature is from 740° C. to 800° C., polycrystalline silicon is etched by chlorine gas, but monocrystalline silicon is hardly etched by chlorine gas. Also, the field silicon oxide layer 4, the gate silicon oxide layer 5 and the sidewall silicon oxide layer 9 are hardly etched by chlorine gas. Thus, only about 100 nm thick upper portions of the gate electrodes 6 are removed, and accordingly, gate electrodes 6' shorter than the sidewall silicon oxide layers 9 are obtained.

Figure 3D:
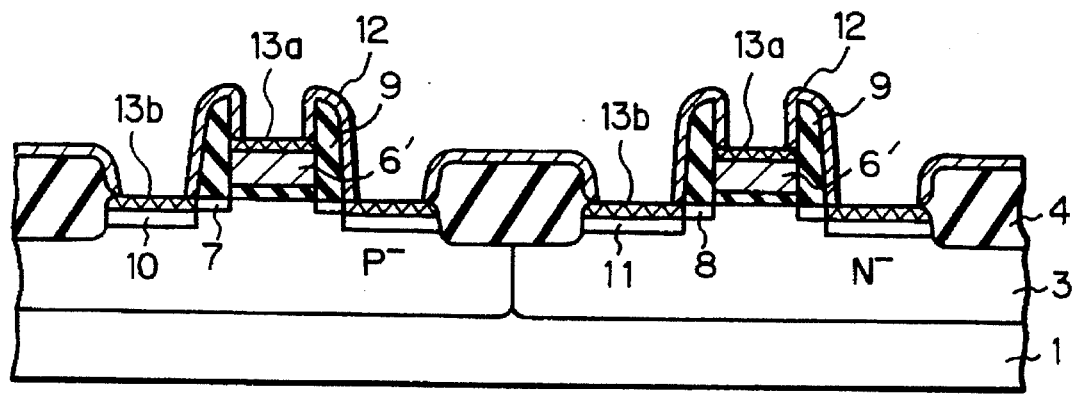

Next, referring to FIG. 3D, in the same way as in FIG. 1C, an about 35 nm thick titanium layer 12 is formed on the entire surface by a sputtering process. Then, the titanium layer 12 is reacted with the gate electrodes 6' and the source/drain regions 10 and 11 by a lamp annealing process at a temperature of about 650° C. for about 10 s, so that titanium silicide layers 13a and 13b are formed in self-alignment with the gate electrodes 6 and the source/drain regions 10 and 11.

Figure 3E:
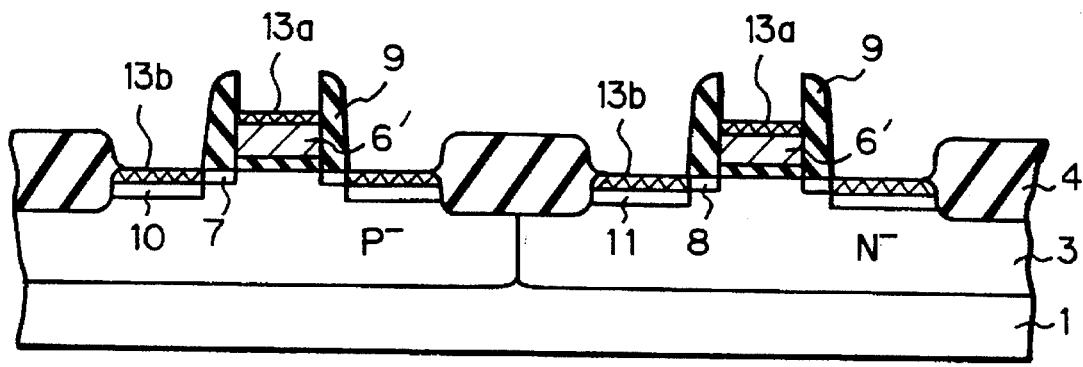

Finally, referring to FIG. 3E, in the same way as in FIG. 1D, unreacted portions of the titanium layer 12 are removed by a wet etching process using hydrogen peroxide water. Further, a lamp annealing process at a temperature of about 850° C. is carried out for about 10 s to further reduce the resistance values of the titanium silicide layers 13a and 13b.

According to the first embodiment of the present invention, since the height of the gate electrodes 6' can be smaller than that of the sidewall silicon oxide layers 9 without removing the field silicon oxide layer 4, the gate silicon oxide layer 5 and the sidewall silicon oxide layer 9, the gate electrodes 6' are completely plectrically-isolated from the source/drain regions 10 and 11, so that no short circuit occurs therebetween. Also, since there is no danger that silicon nitride or PSG will remain on the gate electrodes 6', the titanium silicide layers 13a and 13b can be surely formed.

Figure 5A:
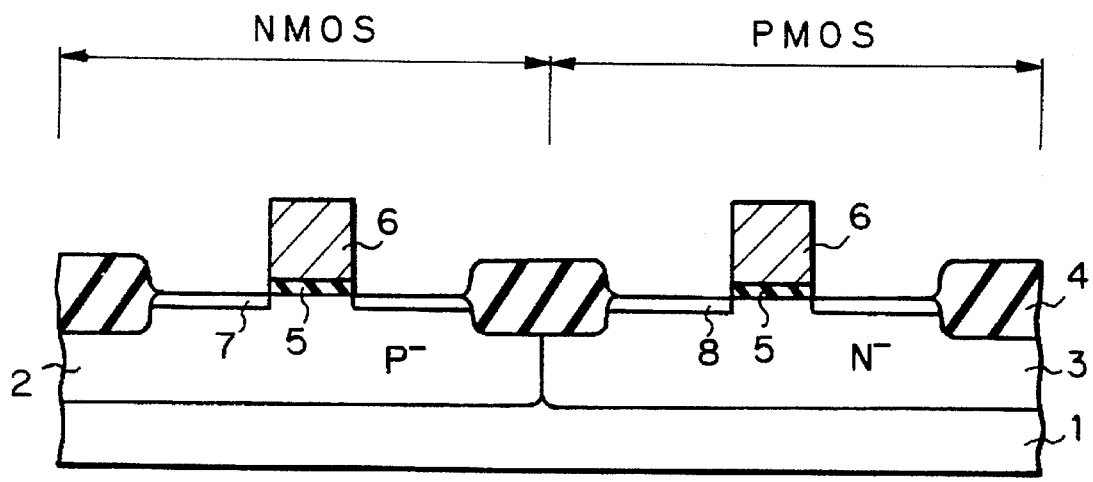
FIGS. 5A through 5F are cross-sectional views illustrating a second embodiment of the method for manufacturing a salicide CMOS device according to the present invention.
Figure 5B:
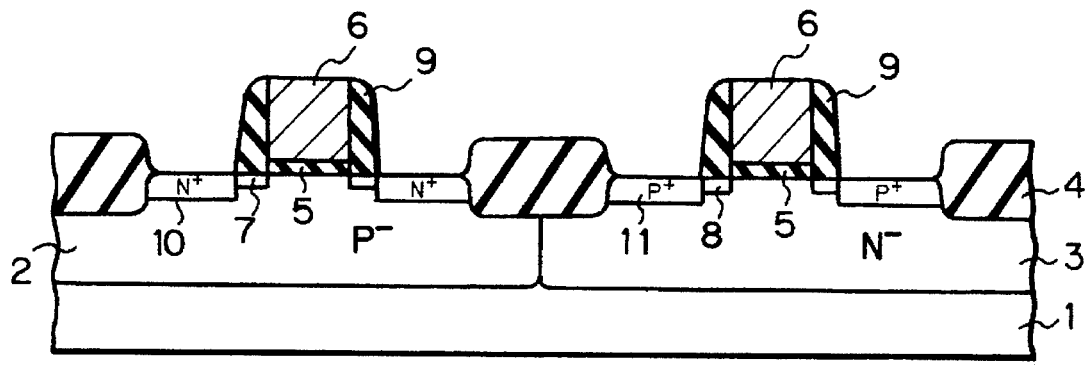
Figure 5C:
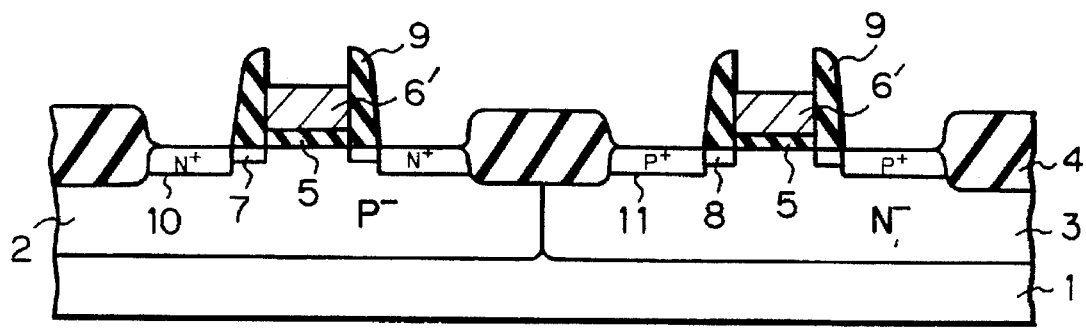
Figure 5D:
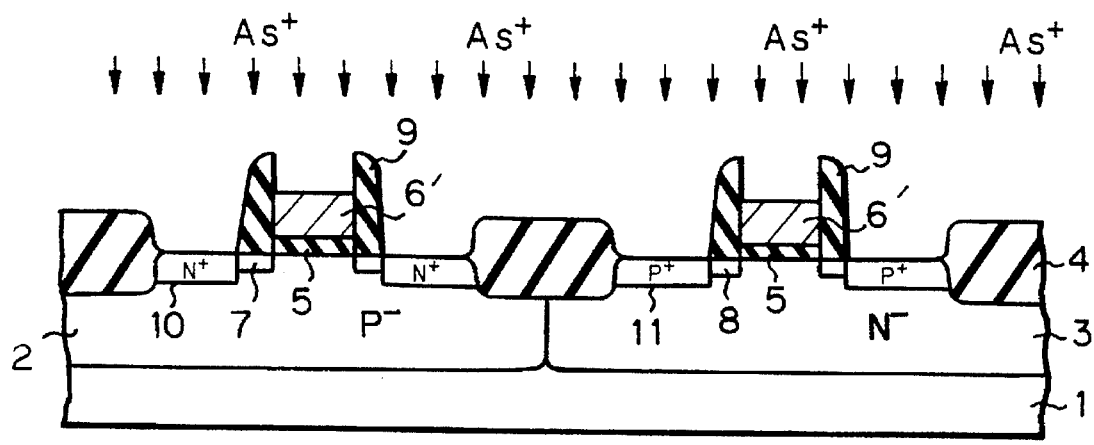
Figure 5E:
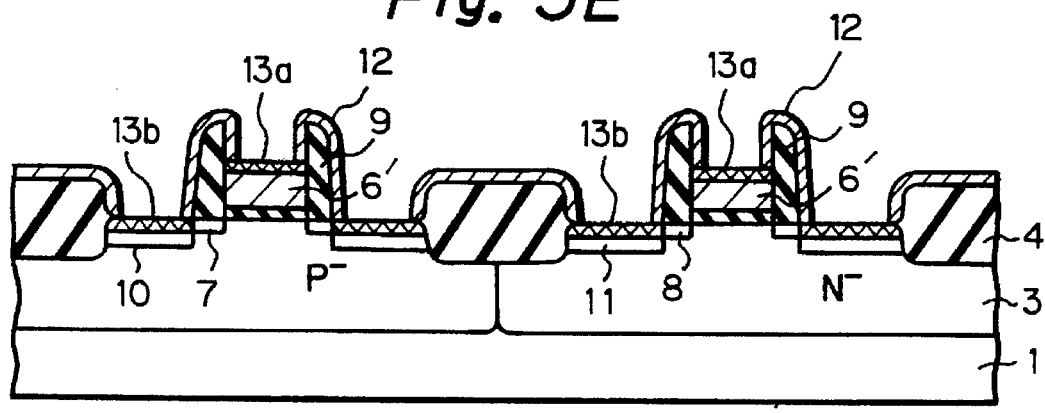
Figure 5F:
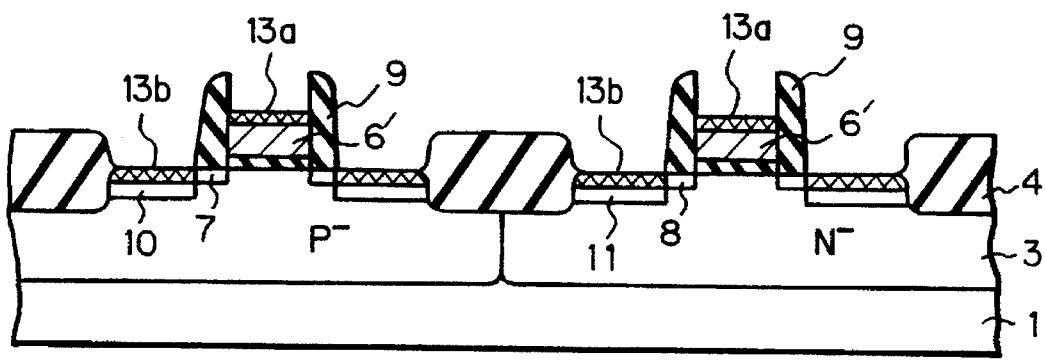

FIGS. 5A through 5F illustrate a second embodiment of the method for manufacturing a salicide LDD-type CMOS device according to the present invention. In the second embodiment, a step as illustrated in FIG. 5D is added to the first embodiment. That is, FIGS. 5A, 5B, 5C, 5E and 5F correspond to FIGS. 3A, 3B, 3C, 3D and 3E, respectively. In the second embodiment, after the gate electrodes 6' are formed as illustrated in FIG. 5C, about $3\times10^{14}$ arsenic ions per square cm are implanted into the device as illustrated in FIG. 5D. Therefore, the upper portions of the gate electrodes 6' and the source/drain regions 10 and 11 become amorphous. As a result, the resistance values of the titanium silicide layers 13a and 13b obtained at steps as illustrated in FIGS. 5E and 5F are further reduced.

Figure 6A:
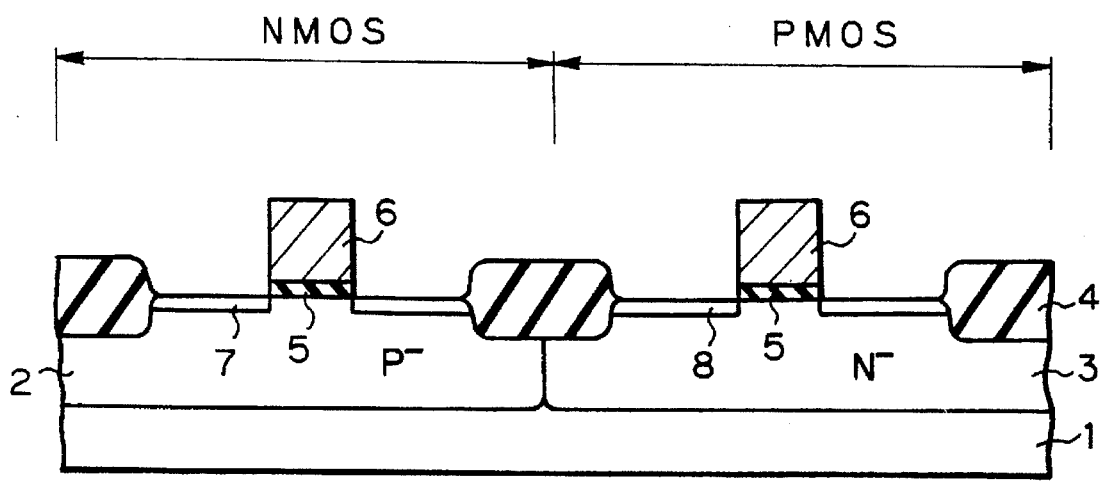
FIGS. 6A through 6F are cross-sectional views illustrating a third embodiment of the method for manufacturing a salicide CMOS device according to the present invention.
Figure 6B:
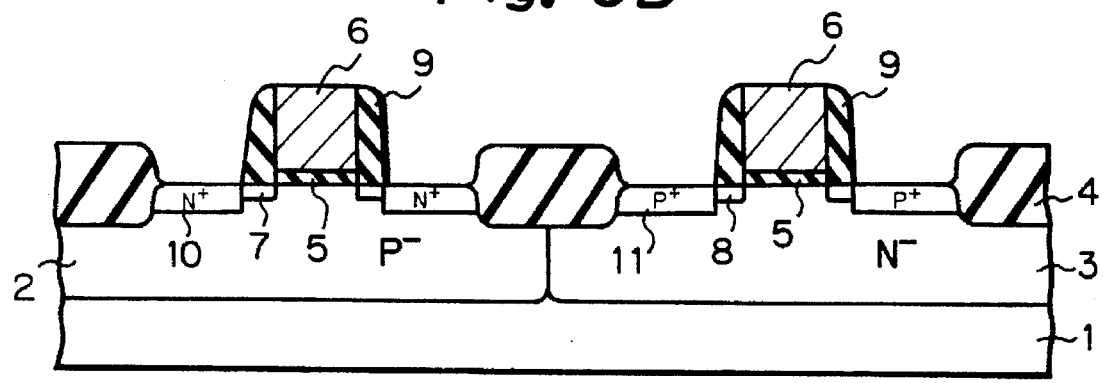
Figure 6C:
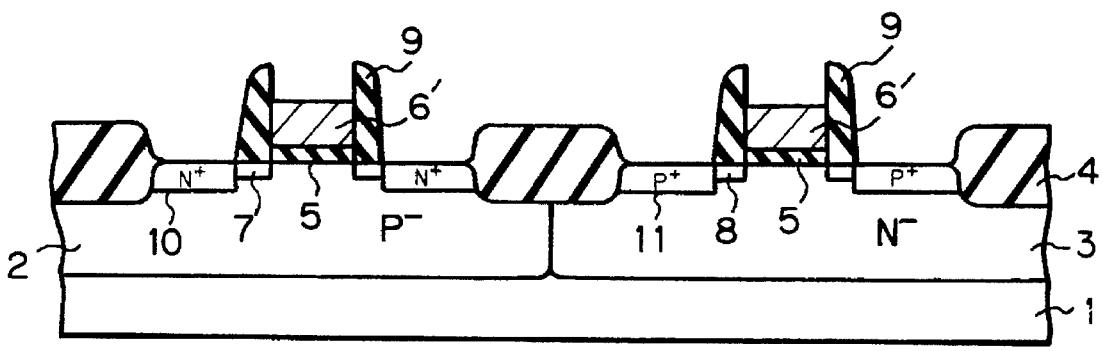
Figure 6D:
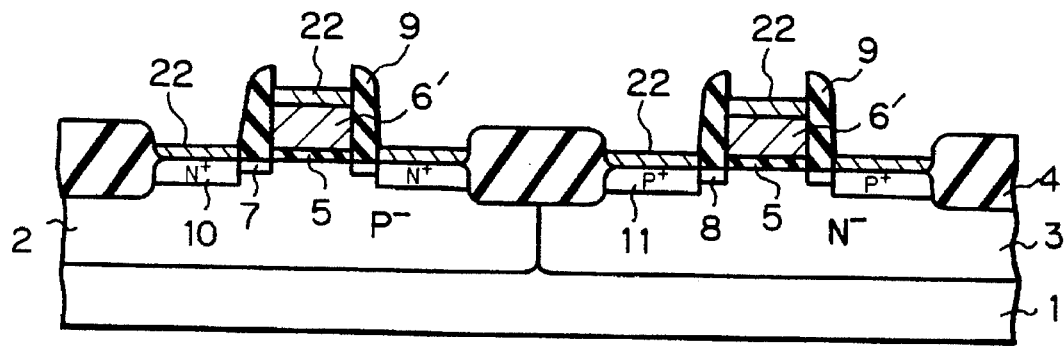
Figure 6E:
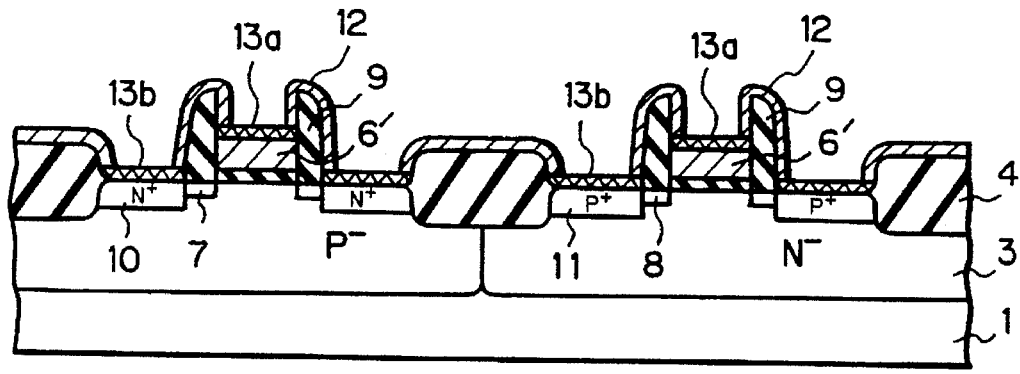
Figure 6F:
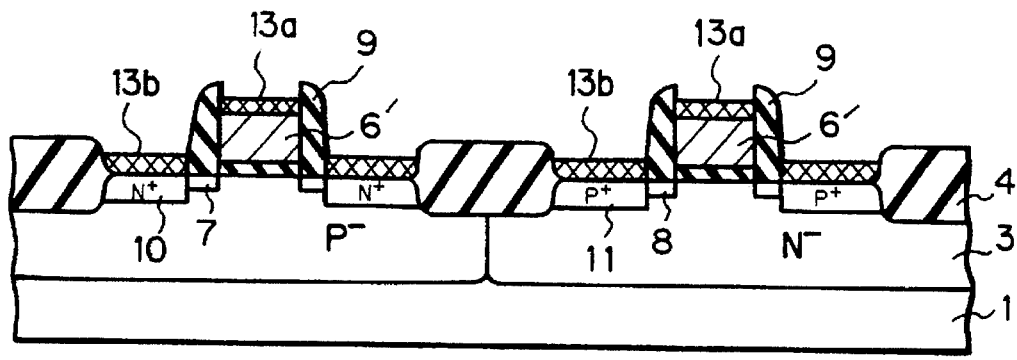

FIGS. 6A through 6F illustrate a third embodiment of the method for manufacturing a salicide LDD-type CMOS device according to the present invention. In the third embodiment, a step as illustrated in FIG. 6D is added to the first embodiment. That is, FIGS. 6A, 6B, 6C, 6E and 6F correspond to FIGS. 3A, 3B, 3C, 3D and 3E, respectively. In the third embodiment, after the gate electrodes 6' are formed as illustrated in FIG. 6C, an N-type polycrystalline silicon layer 22 is formed on the gate electrodes 6' and the source/drain regions 10 and 11. That is, the device is put into a vacuum chamber whose pressure is about $1\times10^{-9}$ Torr. In addition, disilane (or silane) gas is introduced thereinto at a stream rate of about 1 sccm corresponding to a partial pressure of about $1\times10^{-4}$ Torr, and the substrate temperature of the device is caused to be about 600° C. In this case, the growth rate of N-type polycrystalline silicon is 0.12 nm/s on both polycrystalline silicon and monocrystalline silicon such as (100) crystal. As a result, the N-type polycrystalline silicon layer 22 is about 30 nm thick and has an impurity density of about $1\times10^{19}/cm^3$. In this case, note that about 200 nm thick upper portions of the gate electrodes 6 are removed at step as illustrated in FIG. 6C. As a result, the resistance values of the titanium silicide layers 13a and 13b obtained at steps as illustrated in FIGS. 6E and 6F are further reduced.

Figure 7A:
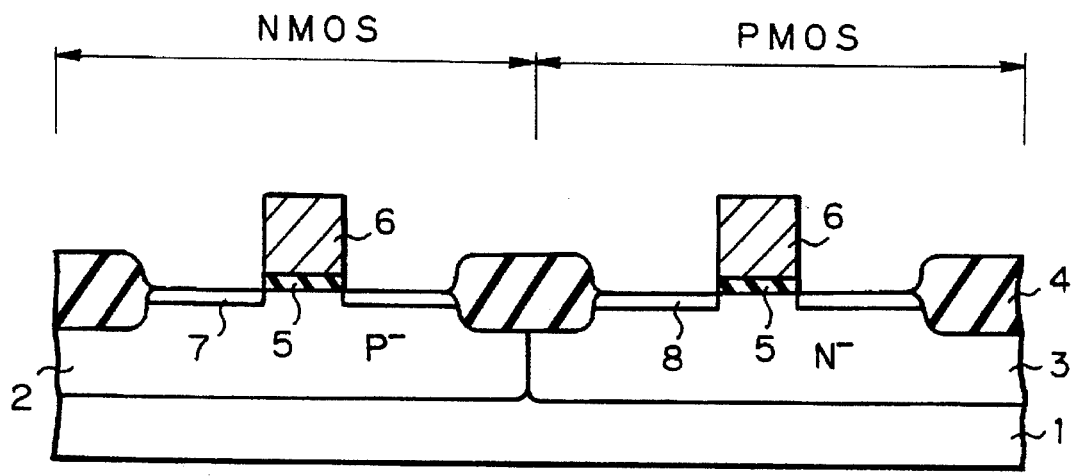
FIGS. 7A through 7G are cross-sectional views illustrating a fourth embodiment of the method for manufacturing a salicide CMOS device according to the present invention.
Figure 7B:
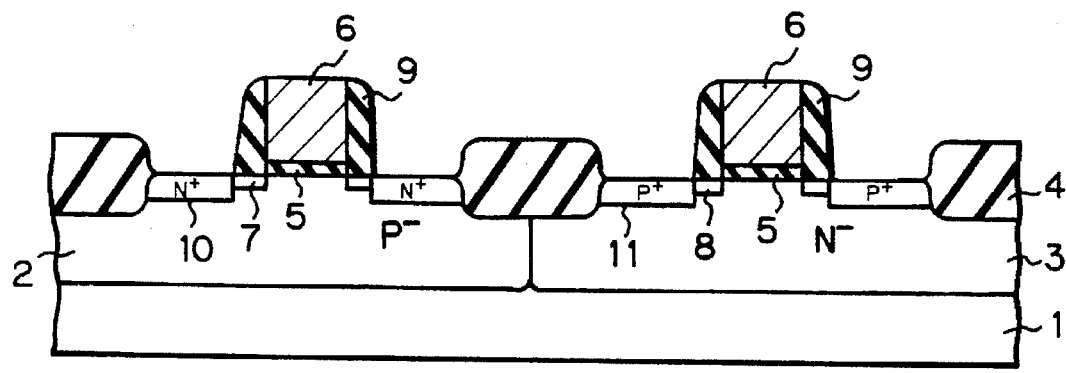
Figure 7C:
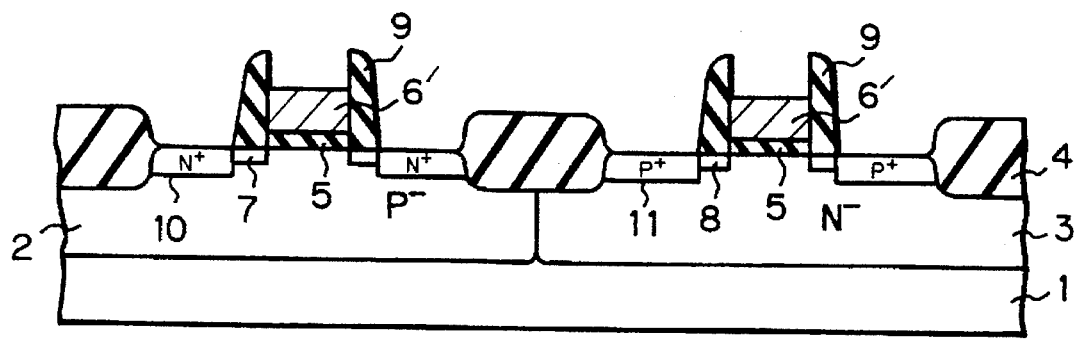
Figure 7D:
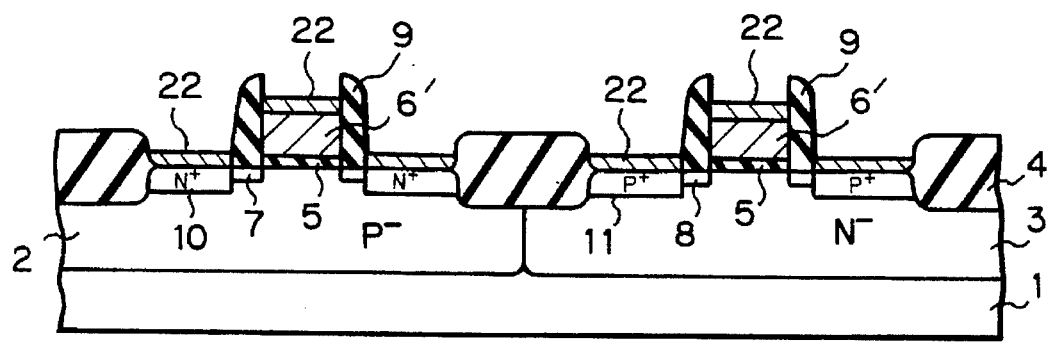
Figure 7E:
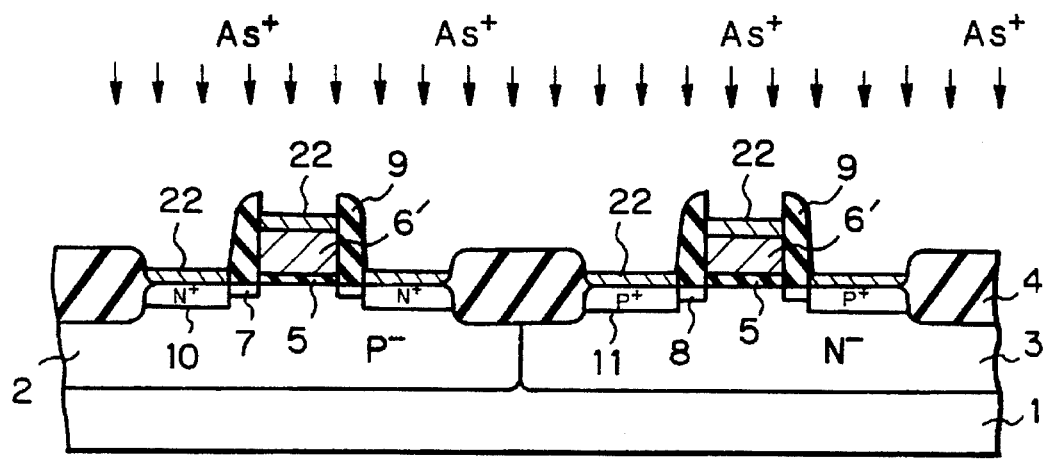
Figure 7F:
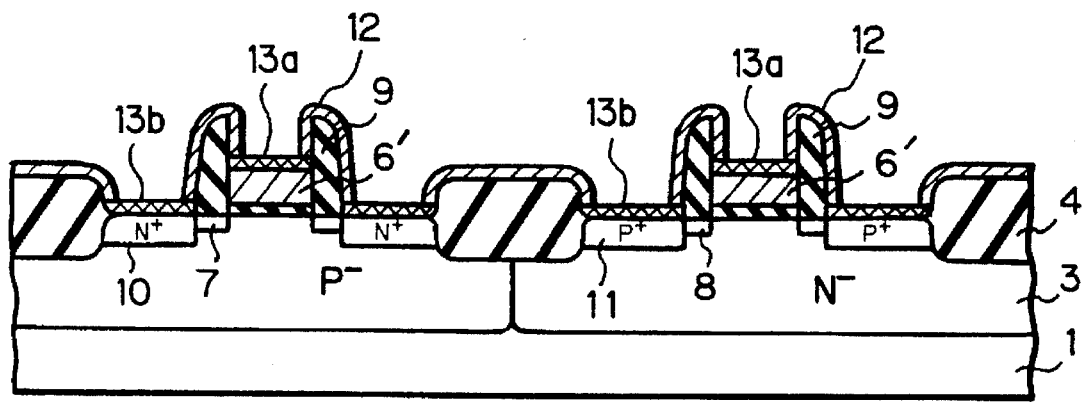
Figure 7G:
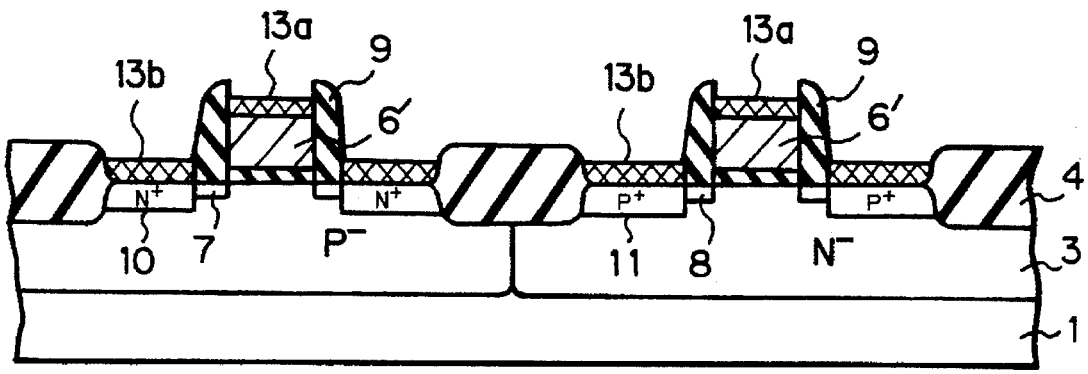

FIGS. 7A through 7G illustrate a fourth embodiment of the method for manufacturing a salicide LDD-type CMOS device according to the present invention. In the fourth embodiment, a step as illustrated in FIG. 7E is added to the third embodiment. That is, FIGS. 7A, 7B, 7C, 7E, 7F and 7G correspond to FIGS. 6A, 6B, 6C, 6D, 6E and 6F, respectively. In the fourth embodiment, after the N-type polycrystalline silicon layer 22 are formed as illustrated in FIG. 7D, about $3\times10^{14}$ arsenic ions per square cm are implanted into the device as illustrated in FIG. 7E. Therefore, the upper portions of the N-type polycrystalline silicon layer 22 become amorphous. As a result, the resistance values of the titanium silicide layers 13a and 13b obtained at steps as illustrated in FIGS. 7F and 7G are further reduced.

FIGS. 8A through 8F illustrate a fifth embodiment of the method for manufacturing a salicide LDD-type CMOS device according to the present invention. In the fifth embodiment, a step for forming a tungsten nitride layer as an etching stopper and a step for forming a tungsten layer as a gate electrode are added to the first embodiment.

Figure 8A:
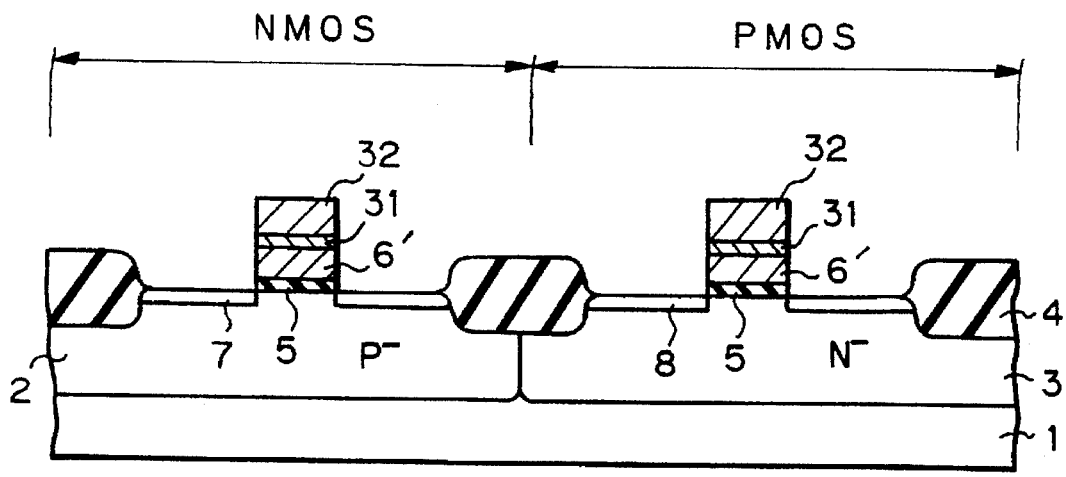
FIGS. 8A through 8F are cross-sectional views illustrating a fifth embodiment of the method for manufacturing a salicide CMOS device according to the present invention.

First, referring to FIG. 8A, a P⁻-type well 2 and an N⁻-type well 3 are formed on a P⁻-type (or N⁻-type) monocrystalline silicon substrate 1. Then, a thick field silicon oxide layer 4 is grown by using a LOCOS process, to partition an NMOS forming area and a PMOS forming area. Then, the P⁻-type well 2 and the N⁻-type well 3 are thermally oxidized to form a gate silicon oxide layer 5. Then, an about 300 nm thick non-doped polycrystalline silicon layer 6', an about 20 nm thick tungsten nitride layer 31 and an about 100 nm thick non-doped polycrystalline silicon layer 32 are sequentially deposited by a CVD process thereon. Then, the non-doped polycrystalline silicon layer 32, the tungsten nitride layer 31 and the gate electrode 6' with the gate silicon layer 5 are patterned by an anistropic etching process to form gate electrodes on the gate silicon oxide layer 5. Then, phosphorous ions are implanted into the source/drain regions of the NMOS forming area with a mask of the gate electrode, to form N⁻-type impurity regions 7. Also, boron ions are implanted into the source/drain regions of the PMOS forming area with a mask of the gate electrode, to form P⁻-type impurity regions 8.

Figure 8B:
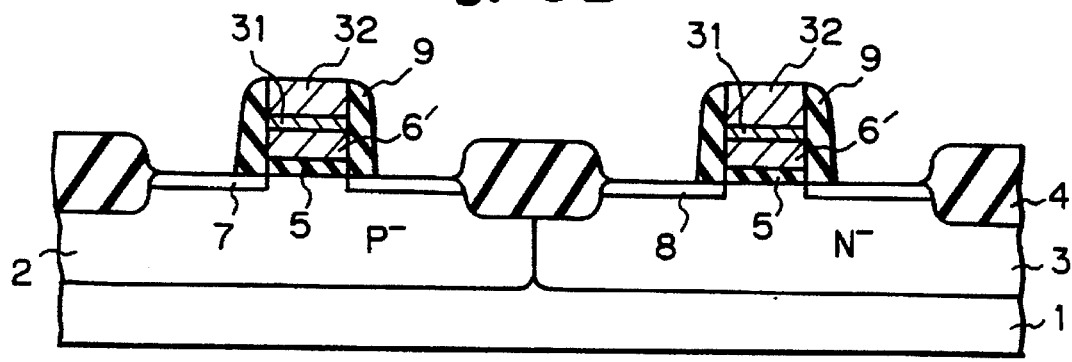

Next, referring to FIG. 8B, in the same way as in FIG. 3B, a silicon oxide layer is formed on the entire surface by a CVD process, and the silicon oxide layer is etched back by an anisotropic etching process. Thus, sidewall silicon oxide layers 9 are formed on sidewalls of the gate electrodes. Then, arsenic ions are implanted into the source/drain regions of the NMOS forming area with a mask of the gate electrode and the sidewall silicon oxide layer 9, to form N⁺-type impurity regions 10. Also, boron ions are implanted into the source/drain regions of the PMOS forming area with am ask of the gate electrode and the sidewall silicon oxide layer 9, to form P⁺-type impurity regions 11.

Figure 8C:
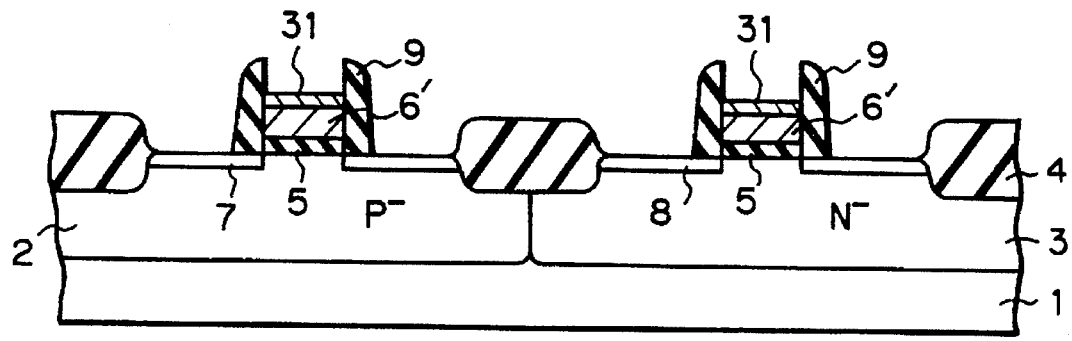

Next, referring to FIG. 8C, only the polycrystalline silicon layer 32 is selectively removed by a vapor phase etching process using chlorine gas. That is, the device is put into a vacuum chamber whose pressure is about $1 \times 10^{-9}$ Torr. In addition, chlorine gas is introduced thereinto at a stream rate of about 1 sccm corresponding to a partial pressure of about $1 \times 10^{-4}$ Torr, and the substrate temperature of the device is caused to be about 740° C. to 880° C. In the same way as in the first embodiment, polycrystalline silicon is etched by chlorine gas, but monocrystalline silicon is hardly etched by chlorine gas. Also, the field silicon oxide layer 4, the gate silicon oxide layer 5 and the sidewall silicon oxide layer 9 are hardly etched by chlorine gas. In addition, since the tungsten nitride layer 31 serves as an etching stopper. Thus, only the polycrystalline silicon layer 32 is removed, and accordingly, gate electrodes shorter than the sidewall silicon oxide layers 9 are obtained.

Figure 8D:
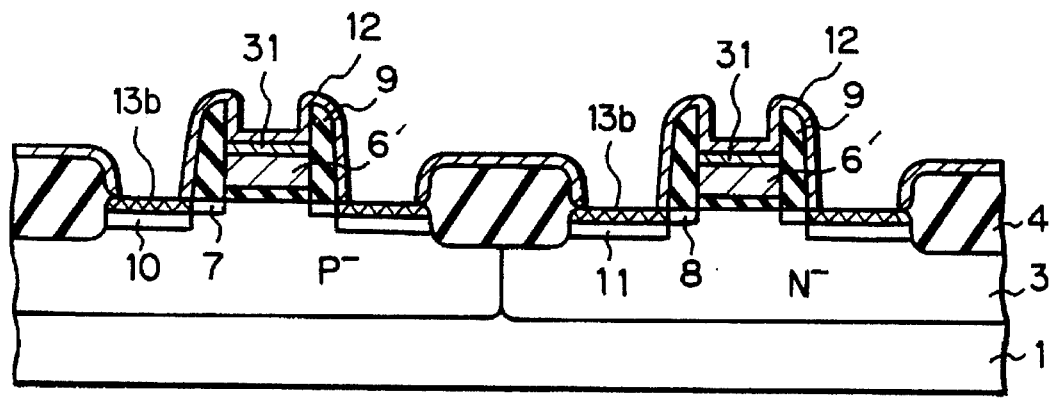
Figure 8E:
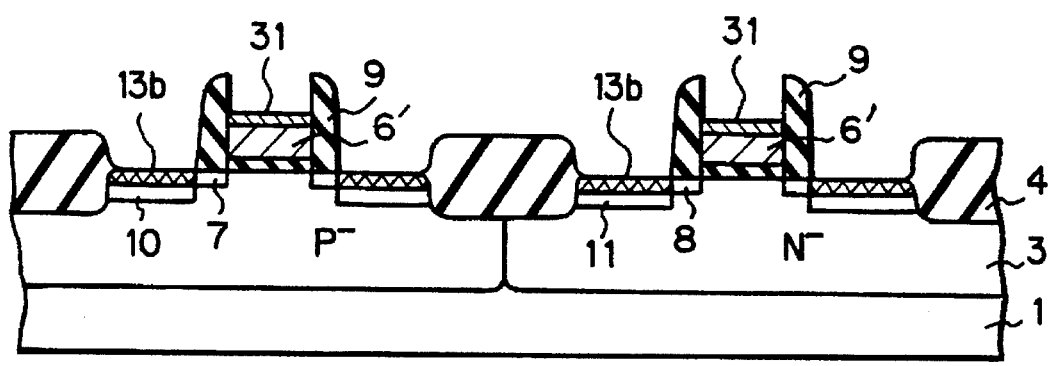

Next, referring to FIG. 8D, in the same way as in FIG. 3D, an about 35 nm thick titanium layer 12 is formed on the entire surface by a sputtering process. Then, the titanium layer 12 is reacted with the source/drain regions 10 and 11 by a lamp annealing process at a temperature of about 650° C. for about 10 s, so that a titanium silicide layer 13b is formed in self-alignment with the source/drain regions 10 and 11.

Figure 8F:
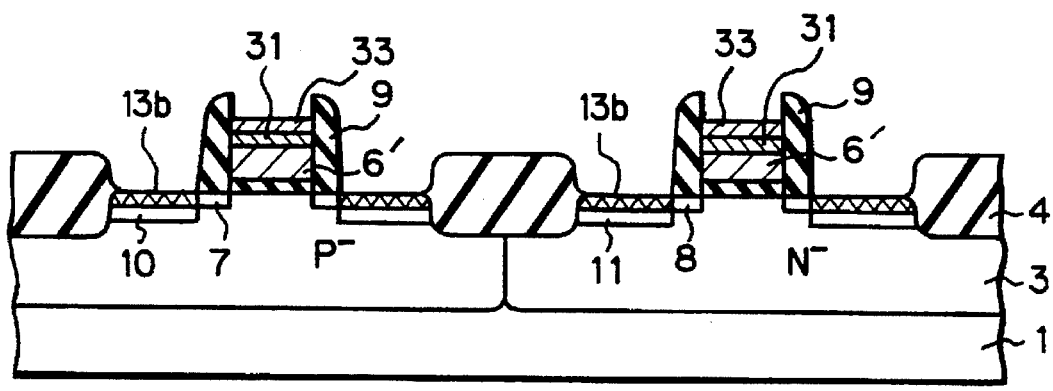

Finally, referring to FIG. 8F, in the same way as in FIG. 3E, unreacted portions of the titanium layer 12 are removed by a wet etching process using hydrogen peroxide water. Further, a lamp annealing process at a temperature of about 850° C. is carried out for about 10 s to further reduce the resistance values of the titanium silicide layer 13b.

Finally, referring to FIG. 8F, an about 80 nm thick tungsten layer 33 is deposited only on the tungsten nitride layer 31 by a CVD process using $WF_6$ gas under hydrogen reduction mode. Thus, the polycrystalline silicon layer 6', the tungsten nitride layer 31 and the tungsten layer 33 serve as a gate electrode.

Also, according to the fourth embodiment of the present invention, since the height of the gate electrodes can be smaller than that of the sidewall silicon oxide layers 9 without removing the field silicon oxide layer 4, the gate silicon oxide layer 5 and the sidewall silicon oxide layer 9, the gate electrodes are completely plectrically-isolated from the source/drain regions 10 and 11, so that no short circuit occurs therebetween. Also, since there is no danger that silicon nitride or PSG will remain on the gate electrodes, the titanium silicide layer 13b can be surely formed.

Figure 9A:
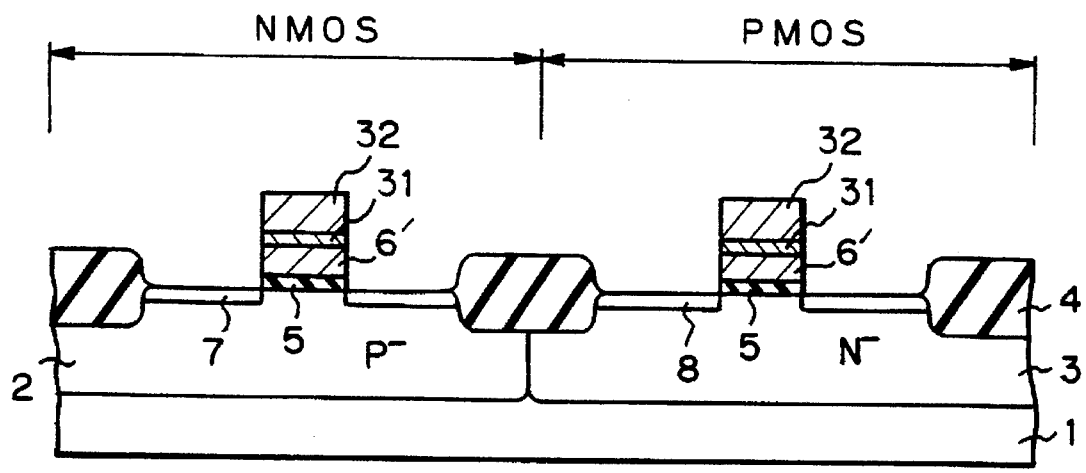
FIGS. 9A through 9G are cross-sectional views illustrating a sixth embodiment of the method for manufacturing a salicide CMOS device according to the present invention.
Figure 9B:
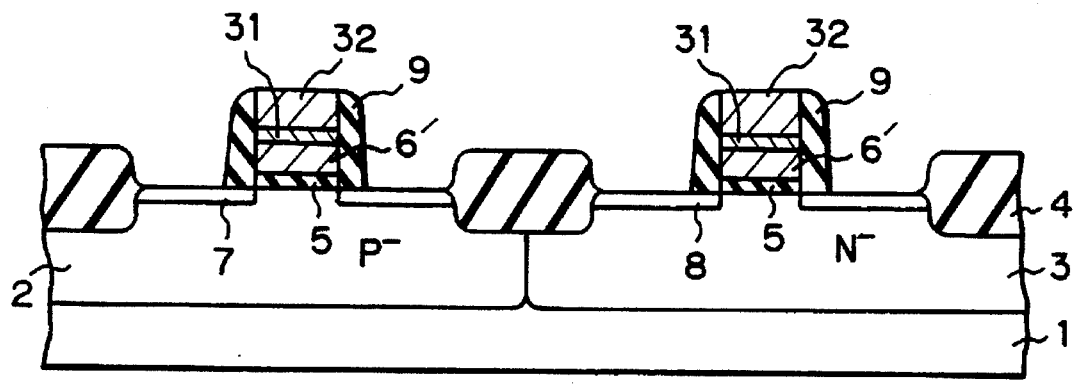
Figure 9C:
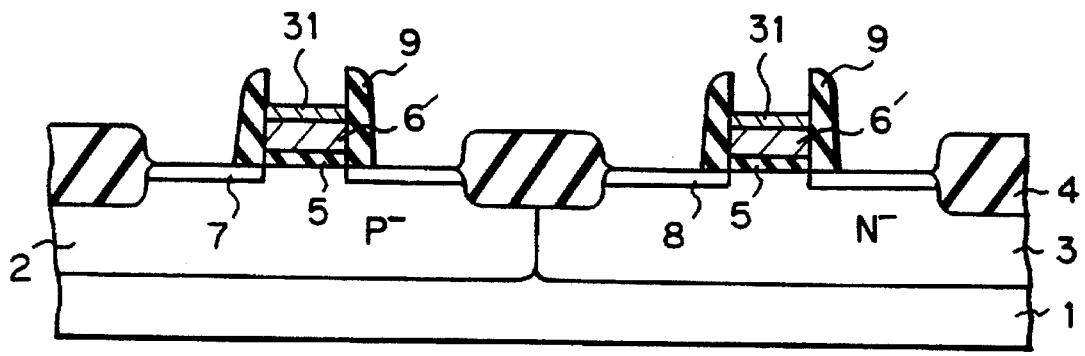
Figure 9D:
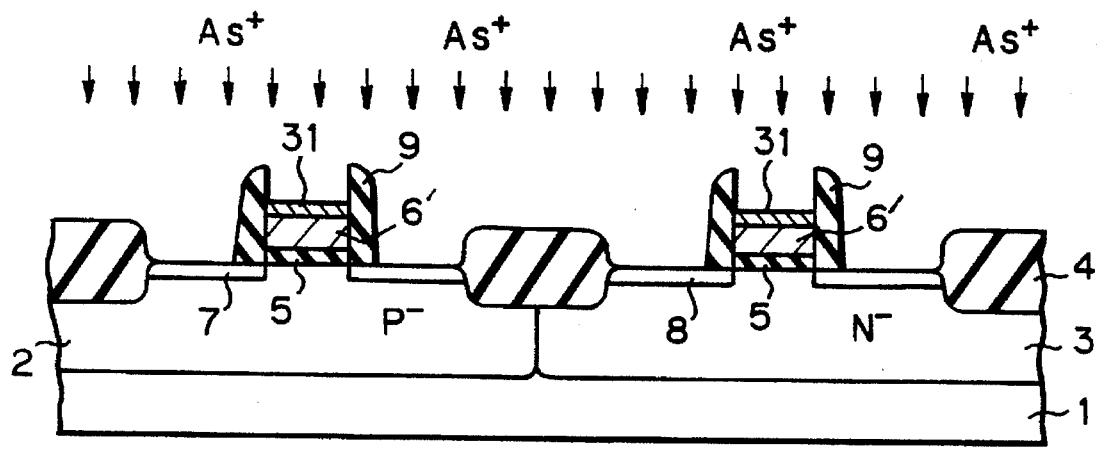
Figure 9E:
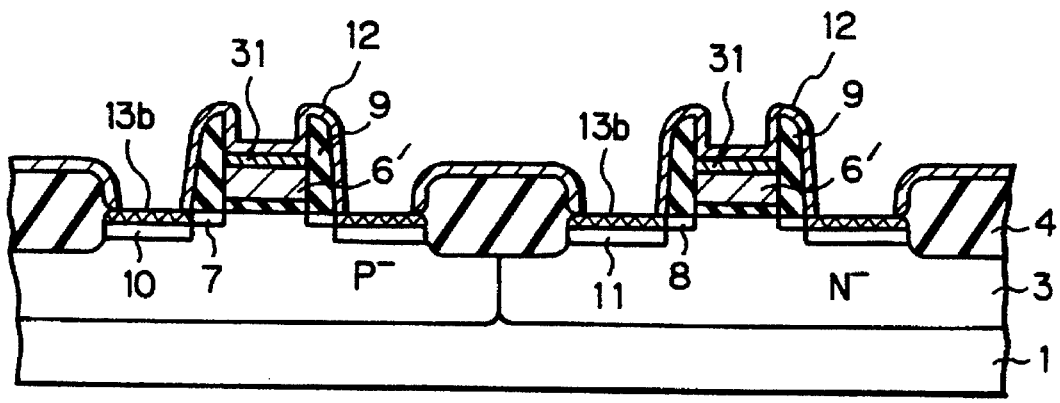
Figure 9F:
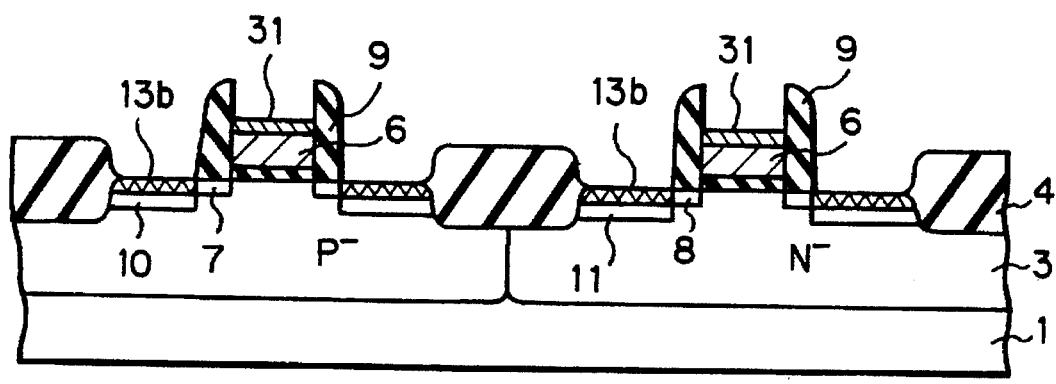
Figure 9G:
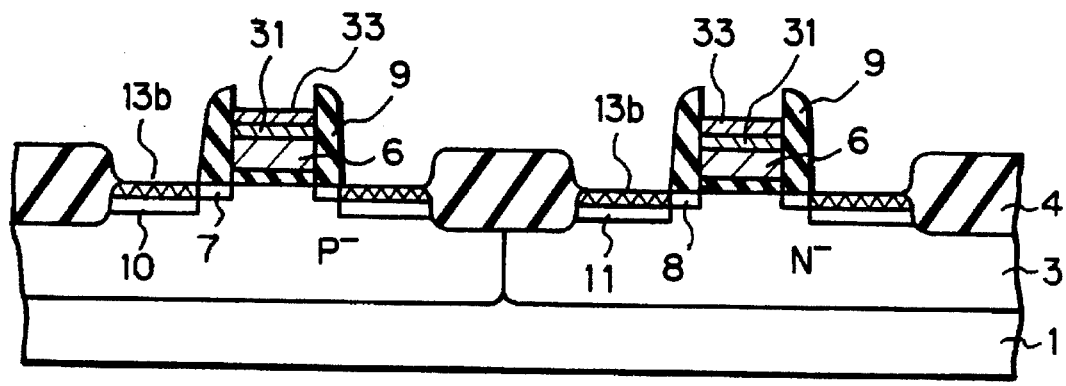

FIGS. 9A through 9G illustrate a sixth embodiment of the method for manufacturing a salicide LDD-type CMOS device according to the present invention. In the sixth embodiment, a step as illustrated in FIG. 9D is added to the fifth embodiment. That is, FIGS. 9A, 9B, 9C, 9E, 9F and 9G correspond to FIGS. 8A, 8B, 8C, 8D, 8E and 8F respectively. In the sixth embodiment, after the polycrystalline silicon layer 33 is removed as illustrated in FIG. 9C, about $3 \times 10^{14}$ arsenic ions per square cm are implanted into the device as illustrated in FIG. 9D. Therefore, the upper portions of the source/drain regions 10 and 11 become amorphous. As a result, the resistance values of the titanium silicide layer 13b obtained at steps as illustrated in FIGS. 9E and 9F are further reduced.

In the above-described embodiments, although the layer 12 is made of titanium, the layer 12 can be made of other refractor metal such as cobalt, nickel or tungsten. Also, $BF_2$ ions or silicon ions can be used instead of arsenic ions for enhancing the amorphous reaction. Further, non-doped polycrystalline silicon can be used for the N-type polycrystalline silicon layer 22 in the third and fourth embodiments.

Further, the present invention can be applied to an N-channel MOS device or a P-channel MOS device other than CMOS devices.

As explained hereinbefore, according to the present invention, since the abnormal growth of metal silicide is avoided so that the gate electrodes are completely electrically-isolated from the source/drain regions, no short circuit occurs therebetween.

I claim:

1. A method for manufacturing a semiconductor device comprising the steps of:

forming a gate insulating layer on a monocrystalline silicon substrate;

forming a polycrystalline silicon gate electrode layer on said gate insulating layer;

forming a sidewall insulating layer on a sidewall of said polycrystalline silicon gate electrode layer;

introducing first impurities into said monocrystalline silicon substrate with a mask of said sidewall insulating layer and said polycrystalline silicon gate electrode layer to form impurity diffusion regions in said monocrystalline silicon substrate;

selectively removing an upper portion of said polycrystalline silicon gate electrode layer after said impurity diffusion regions are formed;

forming a metal layer on said etched polycrystalline silicon gate electrode layer and said impurity diffusion regions;

performing a heating operation upon said metal layer so that said metal layer is reacted with said etched polycrystalline silicon gate layer and said impurity diffusion regions to form metal silicide layers; and removing a portion of said metal layer which is unreacted.

2. The method as set forth in claim 1, wherein said selectively removing step etches said polycrystalline silicon layer by a vapor phase etching process using chlorine gas.

3. The method as set forth in claim 2, wherein said vapor phase etching process is carried out at a substrate temperature of about 740° C. to 800° C.

4. The method as set forth in claim 1, further comprising a step of introducing second impurities into said polycrystalline silicon gate electrode and said impurity diffusion regions of said monocrystalline silicon substrate so that a part of said polycrystalline silicon gate electrode and a part of said impurity diffusion regions become amorphous, after the upper portion of said polycrystalline silicon gate electrode is selectively removed.

5. The method as set forth in claim 4, wherein said second impurities are at least arsenic ions, $BF_2$ ions and silicon ions.

6. The method as set forth in claim 1, further comprising a step of forming a silicon layer including second impurities on said polycrystalline silicon gate electrode and said impurity diffusion regions, after the upper portion of said polycrystalline silicon gate is selectively removed.

7. The method as set forth in claim 6, wherein said silicon layer forming step forms said silicon layer by a vapor phase process using one of silane and disilane.

8. The method as set forth in claim 6, wherein a density of said second impurities in said silicon layer is less than approximately $10^{19}$/cubic cm.

9. The method as set forth in claim 6, further comprising a step of introducing second impurities into said polycrystalline silicon gate electrode and said impurity diffusion regions of said monocrystalline silicon substrate so that a part of said polycrystalline silicon gate electrode and a part of said impurity diffusion regions become amorphous, after said silicon layer is formed.

10. The method as set forth in claim 9, wherein said second impurities are at least arsenic ions, $BF_2$ ions and silicon ions.

11. The method as set forth in claim 1, wherein said metal layer is made of refractory metal.

12. The method as set forth in claim 1, further comprising a step of forming second impurities into said monocrystalline silicon substrate with a mask of said polycrystalline silicon gate electrode layer to form impurity diffusion regions in said monocrystalline silicon substrate, after said polycrystalline silicon gate electrode is formed.

13. A method for manufacturing a semiconductor device comprising the steps of:

forming a gate insulating layer on a monocrystalline silicon substrate;

forming a first polycrystalline silicon layer on said gate insulating layer;

forming a metal nitride layer on said first polycrystalline silicon layer;

forming a second polycrystalline silicon layer on said metal nitride layer;

forming a sidewall insulating layer on a sidewall of said second polycrystalline silicon layer said metal nitride layer and said first polycrystalline silicon layer;

introducing first impurities into said monocrystalline silicon substrate with a mask of said sidewall insulating layer and said second polycrystalline silicon layer to form impurity diffusion regions in said monocrystalline silicon substrate;

removing said second polycrystalline silicon layer after said impurity diffusion regions are formed;

forming a metal layer on said metal nitride layer and said impurity diffusion regions;

performing a heating operation upon said metal layer so that said metal layer is reacted with said impurity diffusion regions to form metal silicide layers; and removing a portion of said metal layer which is unreacted.

14. The method as set for the in claim 13, further comprising a step of forming a metal layer on said metal nitride layer.

15. The method as set forth in claim 13, wherein said metal nitride layer is made of tungsten nitride, and said metal layer is made of tungsten.

16. The method as set forth in claim 13, wherein said selectively removing step etches said second polycrystalline silicon layer by a vapor phase etching process using chlorine gas, said metal nitride layer serving as an etching stopper of said vapor etching process.

17. The method as set forth in claim 16, wherein said vapor phase etching process is carried out at a substrate temperature of about 740° C. to 800° C.

18. The method as set forth in claim 13, further comprising a step of introducing second impurities into said impurity diffusion regions of said monocrystalline silicon substrate so that a part of said impurity diffusion regions become amorphous, after said second polycrystalline silicon layer is removed.

19. The method as set forth in claim 18, wherein said second impurities are at least arsenic ions, $BF_2$ ions and silicon ions.

20. The method as set forth in claim 13, wherein said metal layer is made of refractory metal.

21. The method as set forth in claim 13, further comprising forming second impurities into said monocrystalline silicon substrate with a mask of said second polycrystalline silicon layer, said metal nitride layer and said first polycrystalline silicon layer to form impurity diffusion regions in said monocrystalline silicon substrate, after said second polycrystalline silicon layer is formed.

* * * * *